United States Patent [19]

Yoshimoto et al.

[11] Patent Number: 5,029,141
[45] Date of Patent: Jul. 2, 1991

[54] DYNAMIC SEMICONDUCTOR MEMORY WITH BLOCK DECODING

[75] Inventors: Masahiko Yoshimoto; Tetsuya Matsumura, both of Hyogo, Japan

[73] Assignee: Mitsubishi Denki Kabushiki Kaisha, Tokyo, Japan

[21] Appl. No.: 322,843

[22] Filed: Mar. 14, 1989

[30] Foreign Application Priority Data

Jul. 29, 1988 [JP] Japan .................................. 63-191381

[51] Int. Cl.[5] .............................................. G11C 7/00
[52] U.S. Cl. ........................... 365/230.03; 365/230.05
[58] Field of Search .............. 365/201, 230.03, 230.06, 365/189.08, 236, 230.05

[56] References Cited

U.S. PATENT DOCUMENTS 4,554,646 11/1985 Yoshimoto et al. ............ 365/189.08
4,935,896 6/1990 Matsumura et al. ................ 365/187

OTHER PUBLICATIONS

"Introduction to NMOS and CMOS VLSI System Design", pp. 268-273.

Primary Examiner—James W. Moffitt
Assistant Examiner—Jack A. Lane
Attorney, Agent, or Firm—Lowe, Price, LeBlanc and Becker

[57] ABSTRACT

The dynamic semiconductor memory device comprises a plurality of write block selecting lines and a plurality of read block selecting lines for selecting any one of the memory cell groups, a plurality of write row selecting lines for selecting any memory cells for a word in one of the memory cell groups selected by the write block selecting lines, a purality of first logic gates connected at one input terminals thereof to the write block selecting lines and at the other input terminals thereof to the write row selecting lines, a plurality of divisional write word lines each connecting an output terminal of one of the first logic gates in parallel to the corresponding memory cells for a word, a plurality of read row selecting lines for selecting any memory cells for a word in one of the memory cell groups selected by the read block selecting lines, a plurality of second logic gates connected at one input terminals thereof to the read block selecting lines and at the other input terminals thereof to the read row selecting lines, and a plurality of divisional read word lines each connecting an output terminal of one of the second logic gates in parallel to the corresponding memory cells for a word.

20 Claims, 5 Drawing Sheets

DYNAMIC SEMICONDUCTOR MEMORY WITH BLOCK DECODING

BACKGROUND OF THE INVENTION

1. Field of the Invention

This invention relates to a dynamic semiconductor memory device, and more particularly to reduction of occupation area thereof and improvement in operation speed thereof.

2. Description of the Prior Art

Figure 3:
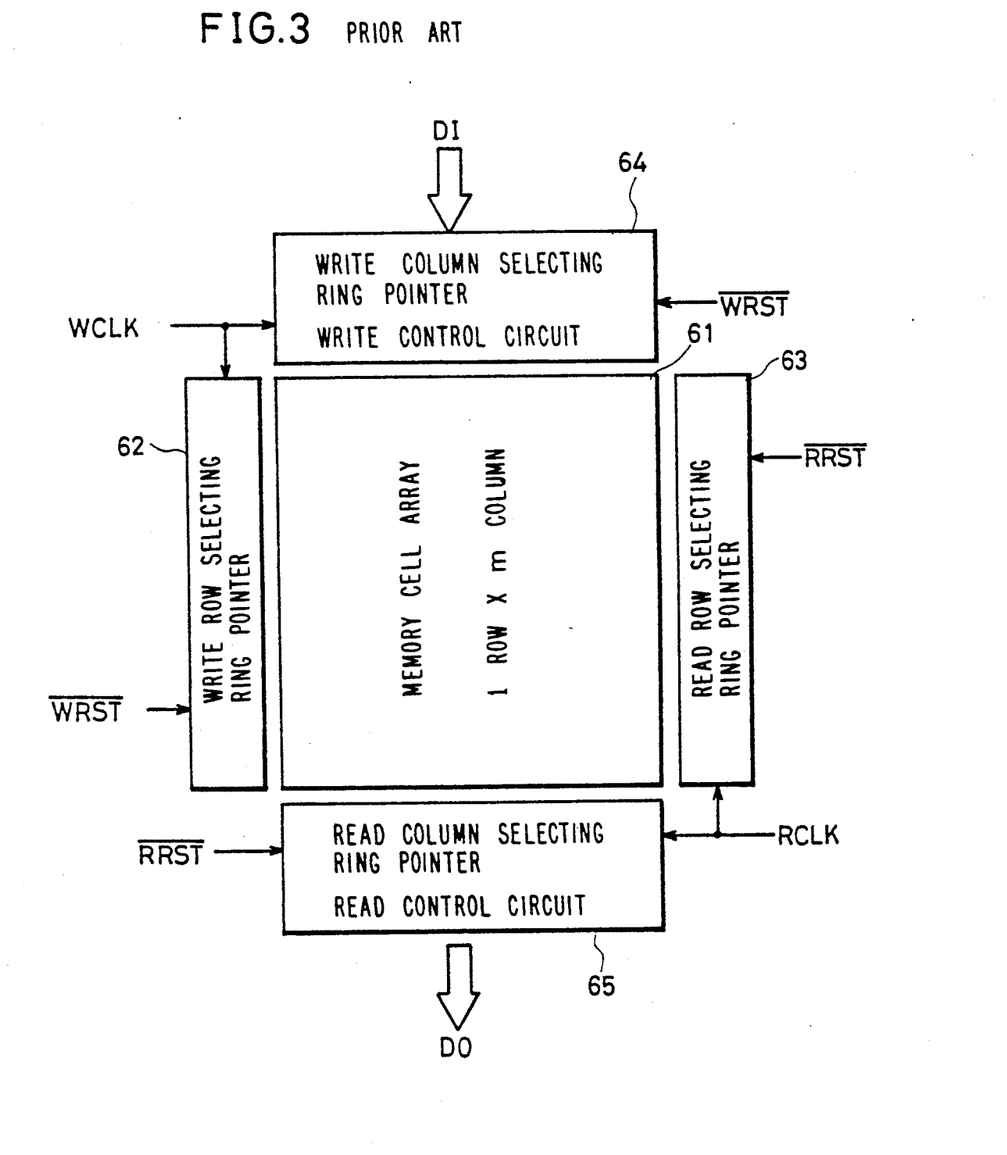
FIG. 3 is a schematic block diagram showing a conventional semiconductor memory device of the FIFO type.

An exemplary one of dynamic semiconductor memory devices is a serial access memory which generally has such a common construction as shown in FIG. 3.

Referring to FIG. 3, the serial access memory device shown includes a memory cell array 61 in which a plurality of memory cells of the three-transistor type are arranged in l row and m columns. A memory cell of the memory cell array 61 to which data is to be written is selected by a write row selecting ring pointer 62 and a write column selecting ring pointer 64. Meanwhile, a memory cell of the memory cell array 61 from which data is to be read out is selected by a read row selecting ring pointer 63 and a read column selecting ring pointer 65. The write column selecting ring pointer 64 includes a write control circuit (not shown in FIG. 3) while the read column selecting ring pointer 65 includes a read control circuit (not shown in FIG. 3).

Figure 4:
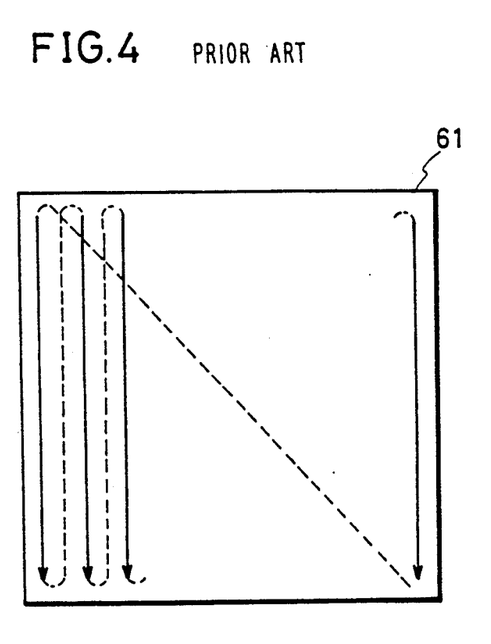
FIG. 4 is a diagram illustrating serial access to a memory cell array of the semiconductor memory device of FIG. 3.

A serial access memory is generally constructed such that memory cells of a memory array thereof are accessed in a predetermined order. Thus, in such a serial access memory as shown in FIG. 3, access to the memory cell array proceeds in such an order as illustrated in FIG. 4. In particular, at first, memory cells in the first column are accessed in an order beginning with a memory cell in the first row and ending with another cell in the l-th row. Then, the memory cells in the second column are accessed in a similar order beginning with a memory cell in the first row and ending with another memory cell in the l-th row. Memory cells in the other columns are accessed in a similar manner until a memory cell in the l-th row in the m-th column is accessed, and after then, the memory cells of the memory cell array are accessed in the same order beginning with the memory cells in the first row in the first column.

In operation, the write row selecting ring pointer 62 and the write column selecting ring pointer 64 are initialized in response to a write reset signal $\overline{WRST}$ received from an external signal source (not shown), and the read row selecting ring pointer 63 and the read column selecting ring pointer 65 are initialized in response to a read reset signal $\overline{RRST}$ also received from the external signal source. As a result of such initialization, the first row in the first column of the memory cell array 61 is designated. Then, the second, third, ... and l-th row in the first column are designated sequentially and after then, the first, second, ..., and l-th row in the second column are designated sequentially in response to write clocks WCLK or read clocks RCLK received from another external signal source (not shown). Thus, after the l-th row in the m-th column is designated, the first row in the first column is designated again, and after then, similar addressing is repeated until another write reset signal $\overline{WRST}$ or another read reset signal $\overline{RRST}$ is received. Input data DI is written by the write control circuit in the write column selecting ring pointer 64 to a memory cell designated by the write row selecting ring pointer 62 and the write column selecting ring pointer 64. To the contrary, information stored in a memory cell designated by the read row selecting ring pointer 63 and the read column selecting ring pointer 65 is read out as output data DO from the read control circuit in the read column selecting ring pointer 65. Writing operation and reading operation are performed independently of each other.

Figure 5:
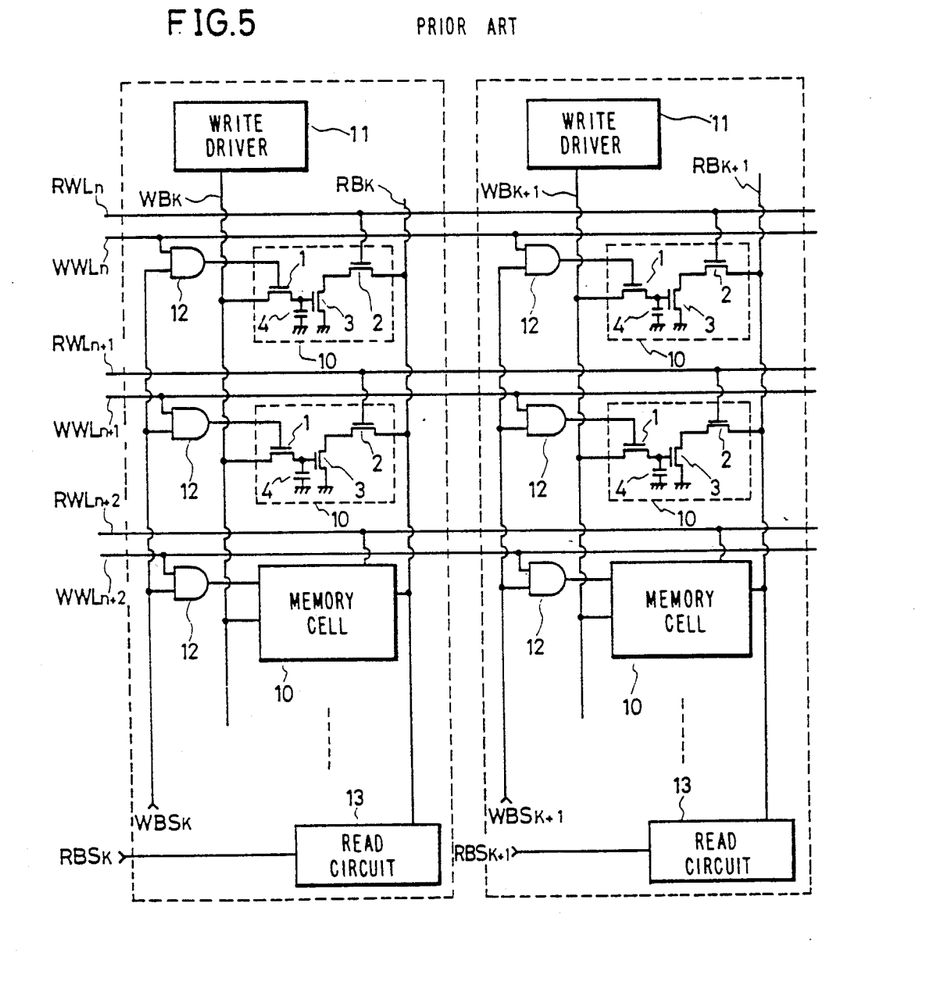
FIG. 5 is a block diagram showing detailed structure of the memory cell array of the semiconductor memory device of FIG. 3.

Referring now to FIG. 5 which schematically illustrates detailed construction of essential part of the serial access memory shown in FIG. 3, a write bit line $WB_k$ and a read bit line $RB_k$ are provided for each column of the memory cell array 61, where k is any integer from 1 through m. A write driver 11 is connected to each write bit line $WB_k$ while a read circuit 13 is connected to each read bit line $RB_k$. Meanwhile, a write word line $WWL_n$ and a read word line $RWL_n$ are provided for each row of the memory cell array 61, where n is any integer from 1 through l. A write selecting gate 12 in the form of an AND gate is provided for each memory cells 10 of the memory cell array 61. Thus, the memory cells 10 in the n-th, (n+1)th and (n+2)th rows in the k-th, and (k+1)th columns of the memory cell array 61 can be seen in FIG. 5. Each of the memory cells 10 includes three N-channel MOS field effect transistors 1, 2 and 3. Each of the memory cells 10 further includes a storage capacitor 4.

Here, the memory cell 10, for example, in the n-th row in the k-th column is considered The transistor 3 of the memory cell 10 considered is connected at the gate thereof to the write bit line $WB_k$ by way of the transistor 1, at the drain thereof to the read bit line $RB_k$ by way of the transistor 2, and at the source thereof to the ground. The transistor 1 is connected at the gate thereof to an output of the write selecting gate 12. The transistor 2 is connected at the gate thereof to the read word line $RWL_n$. The write selecting gate 12 is connected at one of a pair of input terminals thereof to the write word line $WWL_n$ which is in turn connected to the write row selecting ring pointer 62 shown in FIG. 3. The read word line $RWL_n$ is connected to the read row selecting ring pointer 63.

The write selecting gates 12 in each of column are connected to receive at the other respective input terminals thereof a write column selecting signal $WBS_k$ from the write column ring pointer 64. Meanwhile, the read circuit 13 in each column is connected to receive a read column selecting signal $RBS_k$ from the read column selecting ring pointer 65.

In writing operation, when a memory cell 10 for example, in the n-th row in the (k+1)th column is selected by the write row selecting ring pointer 62 and the write column selecting ring pointer 64 shown in FIG. 3, the potential on the write word line $WWL_n$ rises to an "H" level and the write column selecting signal $WBS_{k+1}$ also rises to the "H" level. Consequently, the write selecting gate 12 in the n-th row in the (k+1)th column provides an output of the "H" level to turn the transistor 1 on. As a result, input data DI buffered by the write driver 11 is written to the storage capacitor 4 in the memory cell 10 over the write bit line $WB_{k+1}$.

Thereupon, write column selecting signals WBS for all of the columns other than the (k+1)th column and potentials on the write word lines WWL for all of the rows other than the n-th row present the "L" level Consequently, all of the write selecting gates 12 other than the write selecting gate 12 in the n-th row in the (k+1)th column present the "L" level Accordingly, all of the transistors 1 of the memory cells 10 other than the memory cell 10 in the n-th row in the (k+1)th column remain in the off state so that information stored in the memory cells 10 is maintained.

In reading operation on the other hand, when a memory cell 10, for example, in the n-th row in the (k+1)th column is selected by the read row selecting ring pointer 63 and the read column selecting ring pointer 65, the potential on the read word line $RWL_n$ rises to the "H" level. Thereupon, all information stored in memory cells 10 in the n-th row is red out over the read bit lines $RB_1$ to $RB_m$. In this instance, however, output information is delivered only from the read circuit 13 for the (k+1)th column which is selected by the read column selecting signal $RBS_{k+1}$.

A memory of the FIFO (first-in first-out) type which is a type of serial access memory which includes three-transistor type memory cells is disclosed in "Introduction to NMOS and CMOS VLSI System Design", pp. 268 to 273.

Such a conventional semiconductor memory device which includes three-transistor type memory cells as described above requires gate circuit for selecting a memory cell to which information is to be written.

Accordingly, the semiconductor memory device has a drawback that it requires a large scale for circuitry and a large occupation area due to the presence of such gate circuits.

SUMMARY OF THE INVENTION

It is an object of the present invention to provide a dynamic semiconductor memory device wherein writing operation to every memory cell is performed regularly at a high speed without provision of a gate circuit for every memory cell.

It is another object of the present invention to provide a dynamic semiconductor memory device which requires a comparatively small occupation are and is capable of having a large storage capacity.

In order to attain the objects, according to the present invention, there is provided a dynamic semiconductor memory device which includes a matrix of memory cells arranged in rows and columns and each having one or more write ports and one or more read ports separate from the write ports, the dynamic semiconductor memory device comprising, the matrix being segmented in the direction along the rows into a plurality of memory cell groups each having a width of the memory cells corresponding to a word, a plurality of write block selecting lines for selecting any one of the memory cell groups, a plurality of write row selecting lines for selecting any memory cells for a word in one of the memory cell groups selected by the write block selecting lines, a plurality of gate means connected at one input terminals thereof to the write block selecting lines and the other input terminals thereof to the write row selecting lines, and a plurality of divisional write word lines each connecting an output terminal of one of the gate means in parallel to the corresponding memory cells for a word.

With the dynamic semiconductor memory device, since one write gate circuit is required for memory cells for each word, the area occupied by the dynamic semiconductor memory device can be decreased. Further, since data for a word can be written at a time to memory cells for a word, the operating speed of the dynamic semiconductor memory device can be raised.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

Figure 1:
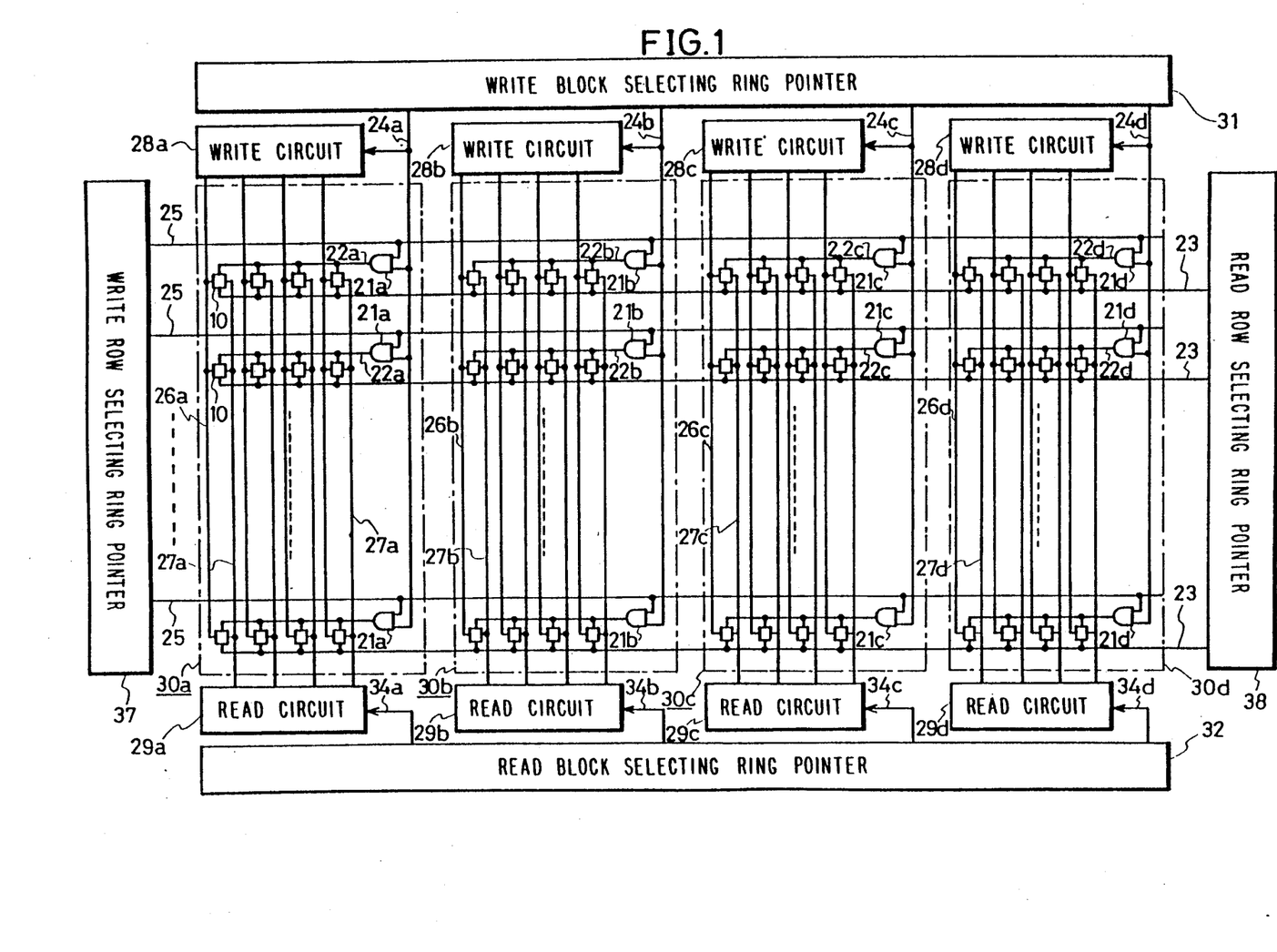
FIG. 1 is a block diagram showing a dynamic semiconductor memory device according to a preferred embodiment of the present invention.

Referring first to FIG. 1, there is shown in a schematic block diagram a semiconductor memory device of the FIFO type embodying the present invention. The semiconductor memory device shown includes an array of memory cells 10 each having a plurality of ports. The array of the memory cells 10 is segmented in the direction along the columns of the memory cell array into four memory cell groups 30a, 30b, 30c and 30d. Each of the memory cell groups 30a to 30d has a width of memory cells 10 corresponding to a word. Thus, where a word includes four bits, each of the memory cell groups 30a to 30d includes four columns of memory cells 10 as seen in FIG. 1. (To the contrary, where a word includes eight bits each of the memory cell groups 30a to 30d naturally includes eight columns of memory cells 10.)

Four write block selecting lines 24a, 24b, 24c and 24d are connected to output terminals of a write block selecting ring pointer 31 and used to select an arbitrary one of the memory cell groups 30a to 30d. A plurality of write row selecting lines 25 extend along divisional write word lines 22a, 22b, 22c and 22d of the memory cell groups 30a to 30d and are connected to output terminals of a write row selecting ring pointer 37.

The write block selecting lines 24a, 24b, 24c and 24d are connected to input terminals of write AND gates 21a, 21b, 21c and 21d, respectively, while the write row selecting lines 25 are connected to the other input terminals of the write AND gates 21a to 21d. The divisional write word lines 22a to 22d are connected to output terminals of the write AND gates 21a to 21d, respectively, and are each connected in parallel to memory cells 10 for a word.

Each of the memory cells 10 may be such a memory cell of the three-transitor type as shown in FIG. 5. thus, the drain of the transistor 1 of each of the memory cells 10, that is, a write port of each memory cell 10, is connected to one of write bit lines 26a, 26, 26c and 26d which are in turn connected to write circuits 28a, 28b, 28c and 28d, respectively. The drain of the second transistor 2 of each memory cell 10, that is, a read port of each memory cell 10, is connected to one of read bit lines 27a, 27b, 27c and 27d which are connected in turn to read circuits 29a, 29b, 29c and 29d, respectively. The gate of the transistor 1 of each memory cell 10 is connected to one of the divisional write word lines 22a to 22d while the gate of the transistor 2 is connected to one of read word lines 23 which are connected to output terminals of a read row selecting ring pointer 38.

The write circuits 28a to 28d each include such a write driver 11 as shown in FIG. 5 and are each activated by a corresponding one of the write block selecting lines 24a to 24d to output write data to a corresponding one of the write bit lines 26a to 26d. The read circuits 29a to 29d are successively activated by read block selecting lines 34a, 34b, 34c and 34d connected to output terminals of a read block selecting ring pointer 32 to amplify and output data read out from the read bit lines 27a to 27d, respectively.

In operation, when data of a word are to be written to memory cells, for example, in the memory cell group 30a, at first the write block selecting ring pointer 31 changes the write block selecting line 24 to the "H" level to select the memory cell group 30a and activate the write circuit 28a of the memory cell group 30a. Thereupon, the write row selecting ring pointer 37 selectively changes one of the write row selecting lines 25 to the "H" level to open a corresponding one of the AND gates 21a. That one of the write word lines 22a which is connected to the output terminal of the thus opened AND gate 21a which presents the "H" level opens the write ports of the corresponding memory cells 10 for a word. Accordingly, the data for a word which are outputted from the write circuit 28a are written at a time to the memory cells 10 for a word via the write bit lines 26a connected to the write circuit 28a. Accordingly, a time required for writing a word is reduced and power consumption is also reduced. Further, where the write row selecting lines 25 are made of a material having a low electric resistance such as aluminum, even if the divisional write word lines 22a to 22d have a rather high specific resistance, high speed operation will not be hindered because the divisional write word lines 22a to 22d have a significantly small length.

In writing operation of data for a word, only one of the write block selecting lines 24a to 24d is changed to the "H" level and only one of the write row selecting lines 25 is changed to the "H" level. Accordingly, data are written only to selected memory cells for a word in a selected memory cell group, and data will never written in error to memory cells which are not selected.

Further, since the write AND gates 21a to 21d must be provided only one for memory cells for each word in the memory device shown in FIG. 1, areas occupied by such write AND gates 21a to 21d are significantly small comparing with such a conventional memory device as described hereinabove wherein an AND gate is required for each of memory cells.

Figure 2:
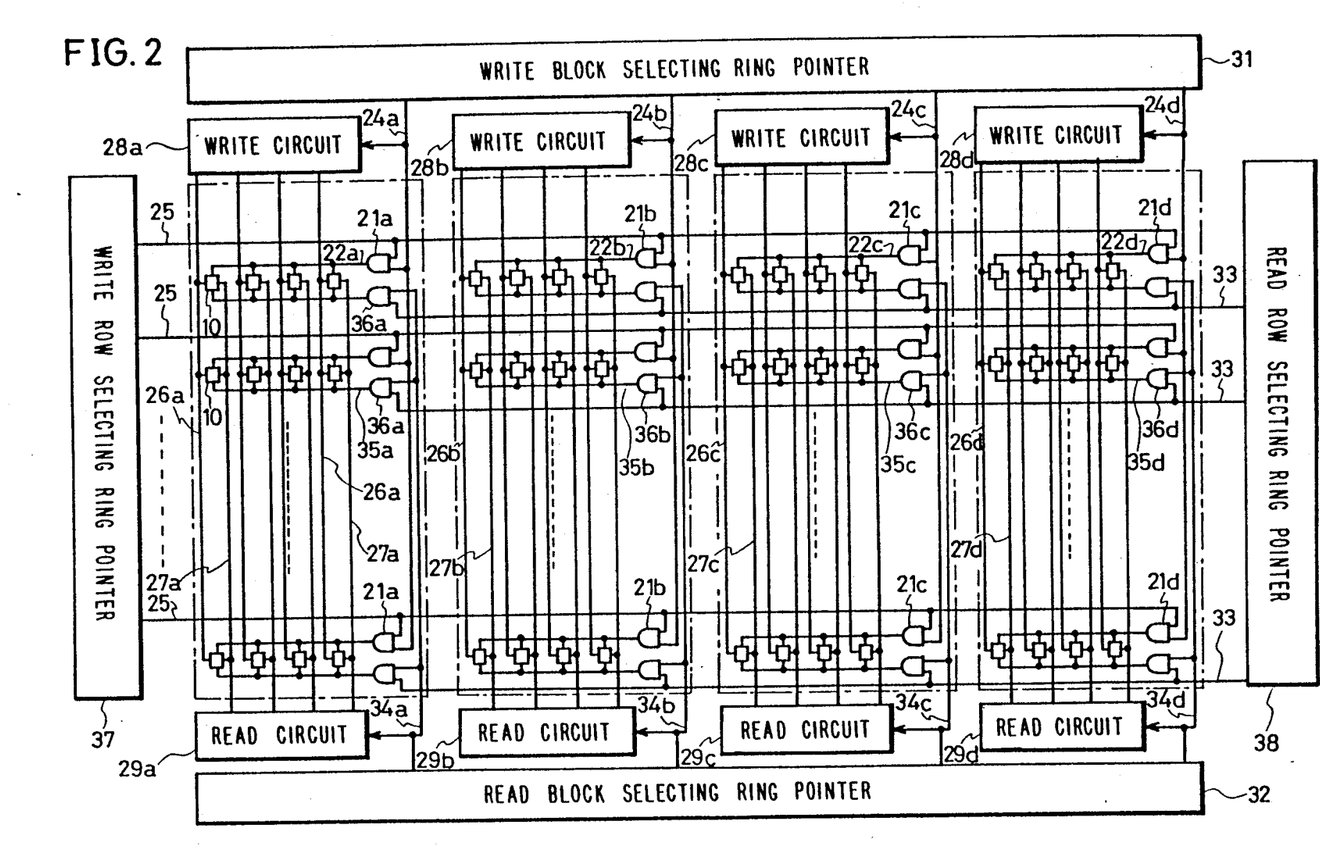
FIG. 2 is a similar view but showing a dynamic semiconductor memory device according to another preferred embodiment of the present invention.

Referring now to FIG. 2, there is shown in schematic circuit diagram a dynamic semiconductor memory device according to a second preferred embodiment of the present invention. The memory device shown is of the FIFO type and similar in general construction to the memory device shown in FIG. 1, and accordingly, like elements are denoted by like reference symbols to those of FIG. 1. The memory device is modified in detailed construction of a circuit for read-out. In particular, read block selecting lines 34a, 34b, 34c and 34d are connected to output terminals of a read block selecting ring pointer 32 and are used to select one of memory cell groups 30a, 30b, 30c and 30d. Read row selecting lines 33 extend along divisional read word lines 35a, 35b, 35c and 45d and are connected to output terminals of a read row selecting ring pointer 38.

The read block selecting lines 34a to 34d are connected to input terminals of read AND gates 36a, 36b, 36c and 36d, respectively, while the read row selecting lines 33 are connected to the other input terminals of the AND gates 36a to 36d. The divisional read word lines 35a to 35d are connected to output terminals of the AND gates 36a to 36d, respectively, and each connected in parallel to memory cells 10 for a word. The gate of the transistor 2 of each of such memory cells 10 as shown in FIG. 5 is connected to one of the divisional read word lines 35a to 35d.

In operation, when data are to be read from memory cells for a word, for example, in the memory cell group 30a, at first the read block selecting ring pointer 32 changes the read block selecting line 34a to the "H" level to select the memory cell group 30a and activate the read circuit 29a. Thereupon, the read row selecting ring pointer 38 changes one of the read row selecting lines 33 to the "H" level to open a corresponding one of the read AND gates 36a. That one of the divisional read word lines 35a which is connected to the output terminal of the thus opened AND gate 36a which is at the "H" level opens the read ports of the corresponding memory cells 10 for a word. Consequently, data are read out from the selected memory cells 10 for a word and amplified by and outputted from the read circuit 29a. Accordingly, data for a word are read at a time, which will raise a speed of reading operation and reduce power consumption. Further, where the read row selecting lines 33 are made of a material having a low electric resistance such as aluminum, even if the divisional read word lines 35a to 35d have a rather high specific resistance, high speed operation will not be hindered because the divisional read word lines 35a to 35d have a significantly small length.

In reading operation of data for a word, only one of the read block selecting lines 34a to 34d is changed to the "H" level and only one of the read row selecting lines 33 is changed to the "H" level. Accordingly, data are read only from selected memory cells for a word in a selected memory cell group, and data will never read out in error from memory cells which are not selected It is to be noted that while the memory devices of the above embodiments are described including four memory cell groups for simplification of the drawings, they may additionally include further memory groups.

Further, while the memory devices of the embodiments are described employing three-transistor type memory cells, any multi-port memory cells each of which has one or more write ports and one or more separate read ports can be employed equivalently.

It is also to be noted that the present invention can be applied not only to a memory device of the FIFO type but also to a random access memory device. In the latter case, each of the ring pointers may be replaced by a decoder.

Although the present invention has been described and illustrated in detail, it is clearly understood that the same is by way of illustration and example only and is not to be taken by way of limitation; the spirit and scope of the present invention being limited only by the terms of the appended claims.

What is claimed is:

1. A memory cell array which includes a matrix of memory cells arranged in rows and columns and each of said memory cells having one or more write ports and one or more read ports separate from said write ports, comprising:

said matrix being segmented in the direction along the columns into a plurality of memory cell groups, each of said memory cell groups having a predetermined plurality of the memory cells corresponding to a word of data;

a plurality of write block selecting lines for selecting any one of said memory cell groups;

a plurality of write row selecting lines for selecting a predetermined plurality of memory cells corresponding to a word of data in one of said memory cell groups selected by said write block selecting lines;

a plurality of gate means, each of connected at a first input terminal thereof to one of said write block selecting lines and at a second other input terminal thereof to one of said write row selecting lines;

a plurality of divisional write word lines each connecting an output terminal of one said gate means in parallel to a corresponding predetermined plurality of memory cells corresponding to a word of data;

a plurality of read block selecting lines for selecting one of said memory cell groups;

a plurality of read row selecting lines for selecting said predetermined plurality of memory cells corresponding to a word of data in one of said memory cell groups selected by said read block selecting lines;

a plurality of second gate means, each connected at a first input terminal thereof to said read block selecting lines and at a second input terminal thereof to said read row selecting lines; and a plurality of divisional read word lines each connecting an output terminal of one of said second gate means in parallel to a corresponding predetermined plurality of memory cells corresponding to a word of data.

2. The memory cell array according to claim 1, wherein
each of said memory cells includes three transistors and a capacitor.

3. The memory cell array according to claim 1, wherein
an input port of each of said memory cells is connected to a corresponding one of a plurality of write bit lines.

4. The memory cell array according to claim 1, wherein
an input port of each of said memory cells is connected to a corresponding one of a plurality of read bit lines.

5. The memory cell array according to claim 1 wherein
each of said gate means is an AND gate.

6. The memory cell array according to claim 1, wherein
each of said second gate means is an AND gate.

7. The memory cell array of claim 1, wherein said memory cells are of random access type.

8. The memory cell array of claim 1, further comprising a write block selecting means for selecting among said write block selecting lines.

9. The memory cell array of claim 1, further comprising write row selecting means for selecting among said write row selecting lines.

10. A memory cell array having a plurality of memory cells arranged in rows and columns, each of said memory cells including a write transfer gate and a read transfer gate, said memory array comprising:

a plurality of divided write word lines (DWWL) arranged in a column for each of a plurality of memory cell groups, each of said plurality of memory cell groups having a plurality of memory cells arranged in a column of rows, each DWWL being connected to control electrodes of write transfer gates of memory cells along a corresponding row within a memory cell group;

a plurality of read word lines (RWL), each being connected to control electrodes of the read transfer gates of memory cells along a corresponding row within a memory cell group;

a plurality of selecting lines provided in each memory cell group;

a plurality of activating means being arranged in a column for each of said plurality of memory cell groups, each said activating means being connected to a corresponding DWWL and a corresponding selecting line for producing a signal for selecting a DWWL;

a plurality of read bit lines being arranged in a row, each being connected to read transfer gates of memory cells of corresponding columns;

a plurality of write bit lines being arranged in a row, each being connected to write transfer gates of memory cells of corresponding columns;

a plurality of write circuit means being arranged for each memory cell group, each said write circuit means being connected to write bit lines in a corresponding memory cell group; and a plurality of read circuit means being arranged for each of said plurality of memory cell groups, each of said read circuit means being connected to read bit lines in a corresponding memory cell group.

11. The memory cell array of claim 10, wherein each of said memory cells further comprises a third MOS transistor and a storage means, said third MOS transistor having a gate connected to a corresponding write bit line through said write transfer gate of said memory cell.

12. The memory cell array of claim 11, further comprising:

read row selecting means connected to each of said read word lines (RWL);

write row selecting means, connected to each of said selecting lines;

read block selecting means connected to said read circuit means; and write block selecting means for selecting said write circuit means.

13. The memory cell array of claim 12, further comprising a write block selecting line for each of said plurality of memory cell groups connected to each of said activating means of a corresponding group of memory cells.

14. The memory cell array of claim 13, wherein the number of memory cells in a single row of a memory cell group corresponds to the space needed for a single word of data.

15. A memory cell array having a plurality of memory cells arranged in rows and column, each of said memory cells including a write transfer gate and a read transfer gate, said memory cell array comprising:

a plurality of divided write word lines (DWWL) arranged in a column for each of a plurality of memory cell groups, each of said memory cell groups having a plurality of memory cells arranged in a column of rows, each DWWL being connected to control electrodes of write transfer gates of memory cells along a corresponding row within a memory cell group;

a plurality of divided read word lines (DRWL) arranged in a column for each of said memory cell groups, each DRWL being connected to control electrodes of the read transfer gates of memory cells along a corresponding row within a memory cell group;

a plurality of selecting lines provided in each of said memory cell groups;

a plurality of read word lines (RWL), provided in each said memory cell group;

a plurality of first activating means being arranged in column for each of said memory cell groups, each of said first activating means being connected to a corresponding DWWL and a corresponding selecting line for producing a signal for selecting a DWWL;

a plurality of second activating means being arranged in a column for each memory cell group, each of said second activating means being connected to a corresponding DRWL and a corresponding RWL;

a plurality of read bit lines being arranged in a row, each being connected to read transfer gates of memory cells of corresponding columns;

a plurality of write bit lines being arranged in a row, each being connected to write transfer gates of memory cells of corresponding columns: p1 a plurality of write circuit means being arranged for each of said memory cell groups, each of said write circuit means being connected to write bit lines in a corresponding memory cell group; and, a plurality of read circuit means being arranged for each of said memory cell groups, each of said read circuit means being connected to read bit lines in a corresponding memory cell group.

16. The memory cell array of claim 15, wherein each of said memory cells further comprises a third MOS transistor and storage means, said third MOS transistor having a gate connected to a corresponding write bit line through said write transfer gate.

17. The memory cell array of claim 16, further comprising:

read row selecting means connected to each of said read word lines (RWL);

write row selecting means connected to each of said selecting lines;

read block selecting means for selecting said read circuit means; and write block selecting means for selecting said write circuit means.

18. The memory cell array of claim 17, further comprising:

a write block selecting line for each of said memory cell groups, connected to said write block selecting means and each of said first activating means of the corresponding memory cell group; and a read block selecting line for each of said memory cell groups, connected to said read block selecting means and each of said second activating means of the corresponding memory cell group.

19. The memory cell array of claim 18, wherein the number of memory cells in a single row of a memory cell group corresponds to the space needed for a single word.

20. A method for writing data into a memory cell array comprising:

a matrix of memory cells arranged in rows and columns and each of said memory cells having one or more write ports and one or more read ports separate from said write ports, said matrix being segmented in the direction along the columns into a plurality of memory cell groups, each of said memory cell groups having a predetermined plurality of the memory cells corresponding to a word of data a plurality of write block selecting lines for selecting any one of said memory cell groups a plurality of write row selecting lines for selecting said predetermined plurality of memory cells corresponding to a word of data in one of said memory cell groups selected by said write block selecting lines a plurality of gate means, each connected at a first input terminal thereof to said write block selecting lines and at a second input terminal thereof to said write row selecting lines a plurality of divisional write word lines each connecting an output terminal of one said gate means in parallel to a corresponding predetermined plurality memory cells corresponding to a word a plurality of read block selecting lines for selecting any one of said memory cell groups a plurality of read row selecting lines for selecting said predetermined plurality of memory cells corresponding to a word of data in one of said memory cell groups selected by said read block selecting lines a plurality of second gate means, each connected at a first input terminal thereof to said read block selecting lines and at a second input terminal thereof to said read row selecting lines and a plurality of divisional read word lines each connecting an output terminal of one of said second gate means in parallel to the corresponding memory cells for a word; said method comprising:

dividing said matrix of memory cells into discrete groups along the entire latitudinal dimension of said memory cell matrix, each group arranged as a column of memory cell rows, each of said rows containing a predetermined plurality of memory cells corresponding to a word of data;

selecting one of said groups of memory cells;

selecting one of said rows in a selected group of memory cells;

simultaneously activating all of said memory cells in a selected row in said selected group of memory cells; and writing data in parallel to all said memory cells in said selected row of said selected group of memory cells.

* * * * *